United States Patent
Hong et al.

(10) Patent No.: US 9,349,453 B2
(45) Date of Patent: May 24, 2016

(54) SEMICONDUCTOR MEMORY CELL AND DRIVER CIRCUITRY WITH GATE OXIDE FORMED SIMULTANEOUSLY

(71) Applicants: Cheong Min Hong, Austin, TX (US); Tahmina Akhter, Austin, TX (US); Gilles J. Muller, Austin, TX (US)

(72) Inventors: Cheong Min Hong, Austin, TX (US); Tahmina Akhter, Austin, TX (US); Gilles J. Muller, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 28 days.

(21) Appl. No.: 14/470,374

(22) Filed: Aug. 27, 2014

(65) Prior Publication Data

US 2016/0064082 A1   Mar. 3, 2016

(51) Int. Cl.
| | |
|---|---|
| G11C 11/34 | (2006.01) |
| G11C 16/04 | (2006.01) |
| H01L 27/115 | (2006.01) |
| H01L 21/8234 | (2006.01) |
| H01L 29/66 | (2006.01) |
| H01L 21/265 | (2006.01) |
| H01L 29/788 | (2006.01) |
| H01L 29/78 | (2006.01) |
| H01L 29/423 | (2006.01) |
| H01L 21/3213 | (2006.01) |
| G11C 16/24 | (2006.01) |
| G11C 16/08 | (2006.01) |

(52) U.S. Cl.
CPC ............ *G11C 16/0433* (2013.01); *G11C 16/08* (2013.01); *G11C 16/24* (2013.01); *H01L 21/26513* (2013.01); *H01L 21/32133* (2013.01); *H01L 21/823437* (2013.01); *H01L 21/823481* (2013.01); *H01L 21/823493* (2013.01); *H01L 27/11524* (2013.01); *H01L 27/11526* (2013.01); *H01L 29/42324* (2013.01); *H01L 29/66575* (2013.01); *H01L 29/66825* (2013.01); *H01L 29/788* (2013.01); *H01L 29/7833* (2013.01)

(58) Field of Classification Search
CPC .... G11C 16/0433; G11C 16/08; G11C 16/24; H01L 21/26513; H01L 21/32133; H01L 21/823437; H01L 21/823481; H01L 21/823493; H01L 27/11524; H01L 27/11526; H01L 29/42324; H01L 29/66575; H01L 29/66825; H01L 29/7833; H01L 29/788
USPC ................. 365/185.05, 51, 53, 174, 177, 186
See application file for complete search history.

(56) References Cited

U.S. PATENT DOCUMENTS

| | | | |
|---|---|---|---|
| 7,339,829 B2 | 3/2008 | Sarig | |
| 7,948,020 B2 | 5/2011 | Roizin et al. | |
| 2006/0105522 A1* | 5/2006 | Steimle | B82Y 10/00 438/257 |

* cited by examiner

*Primary Examiner* — Fernando Hidalgo

(57) ABSTRACT

The present disclosure provides for semiconductor structures and methods for making semiconductor structures. In one embodiment, isolation regions are formed in a substrate, and wells are formed between the isolation regions. The wells include a first low voltage well and a second low voltage well in a logic region of the substrate, and a memory array well in an NVM region of the substrate. A first layer of oxide is formed over the first low voltage well and the memory array well, and a second layer of oxide is formed over the second low voltage well, the second layer being thinner than the first layer. Gates are formed over the wells, including a first gate over the first low voltage well, a second gate over the second low voltage well, and a memory cell gate over the memory array well. Source/drain extension regions are formed around the gates.

13 Claims, 12 Drawing Sheets

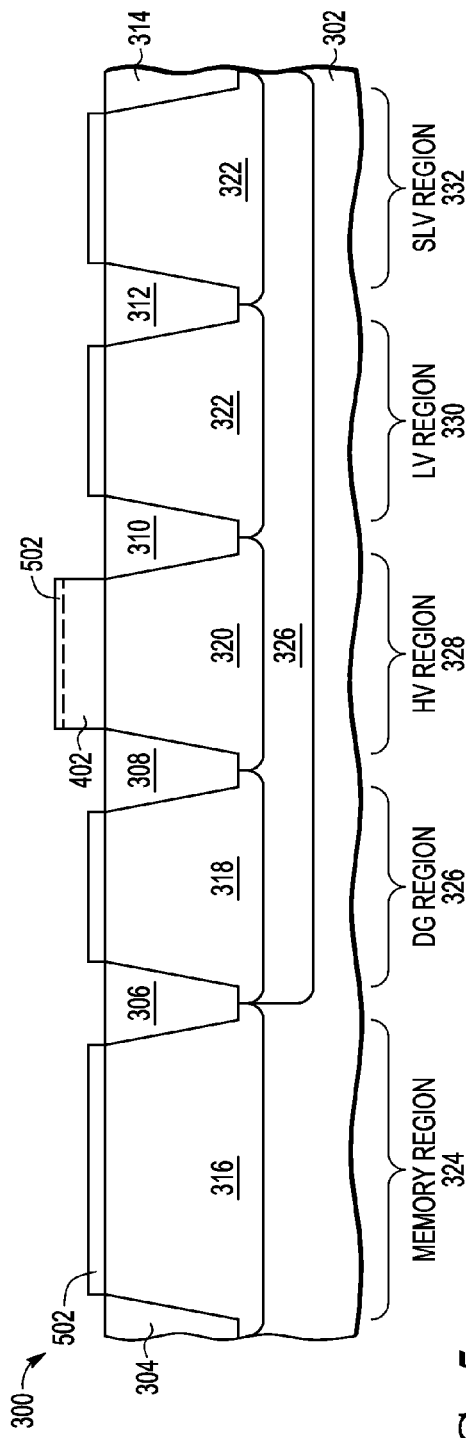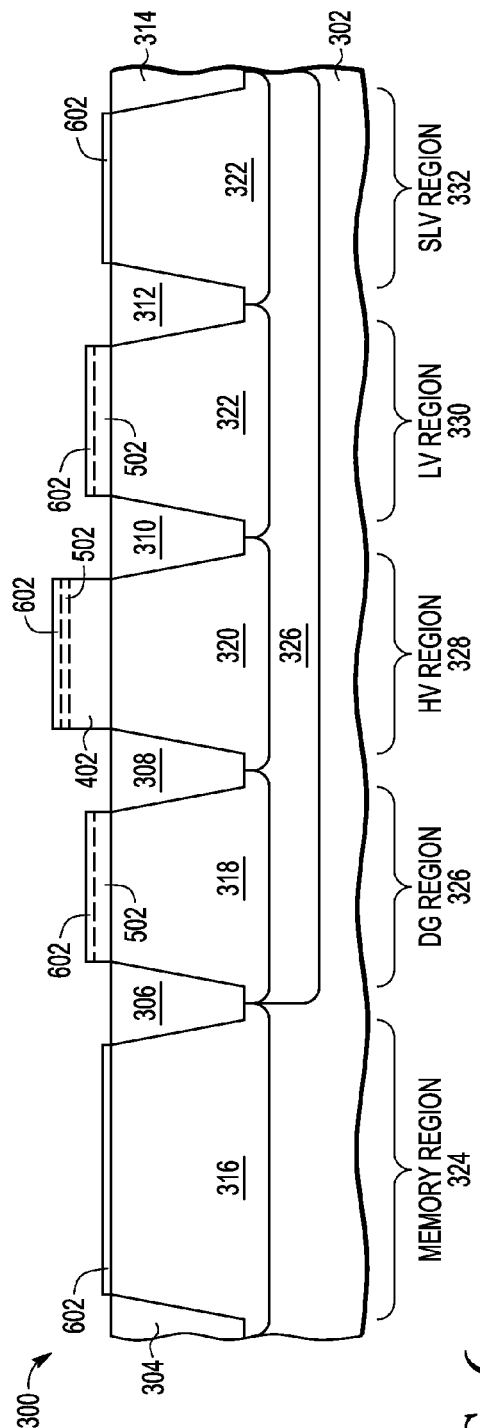

SEMICONDUCTOR MEMORY CELL AND DRIVER CIRCUITRY WITH GATE OXIDE FORMED SIMULTANEOUSLY

BACKGROUND

1. Field

This disclosure relates generally to semiconductor devices, and more specifically, to memory cells formed on a same substrate with driver circuitry for the memory cells.

2. Related Art

As semiconductor devices continue to decrease in size and power requirements and performance requirements increase, manufacturers continually seek ways to improve device performance while reducing size and power used by the devices. Devices that operate in different additional power domains may be added, for which transistors having gate sizes that are different from other transistors may be required. While memory cells, low power logic devices, and high power logic devices can be fabricated on the same substrate, different mask steps are required to form the different devices, including different masks for different gate sizes. For example, adding low power logic transistors to a substrate with memory cells and high power logic devices can require five additional masks, which increases costs and fabrication time. Yet, if high and low power logic devices are formed with the same gate oxide to save mask steps, the low power devices will operate slowly, sacrificing speed in favor of lower manufacturing costs.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIGS. 3-14 show side cross-sectional views of embodiments of a memory cell, high power logic, and low power logic regions in a memory system during subsequent stages of manufacture.

DETAILED DESCRIPTION

In some embodiments, semiconductor devices and methods are disclosed in which gate oxides for a memory cell and supra low power devices are formed at the same time, while gate oxides for low, medium, and high power and dual gate oxide devices are formed independently from one another and from the memory cell and supra low power devices. Additionally, gate polysilicon for low, medium, high and supra low power devices are formed at the same time, typically after the polysilicon for the gate(s) in the memory cell are formed. Source/drain extension and lightly doped drain (LDD) implants for supra low power devices and low power devices are formed at the same time. The LDD implant for the supra low power device provides lower off current, which is more suitable for logic devices used in row and column select drivers for the memory cell. The thin gate oxide results in higher drive current from the supra low power devices, increasing performance while requiring less space due to smaller gate sizes.

As used herein, the term "supra low power" refers to power that is higher than low power and lower than medium or high power. For example, low power can refer to voltages less than 1.1 Volts, supra low power can refer to voltages less than 2.0 Volts, medium power can refer to voltages less than 5.0 Volts and high power can refer to voltages less than 9 Volts. Other suitable ranges of voltage can be used for low, supra low, medium, and high power voltages with the values here given for purposes of example only.

Figure 1:
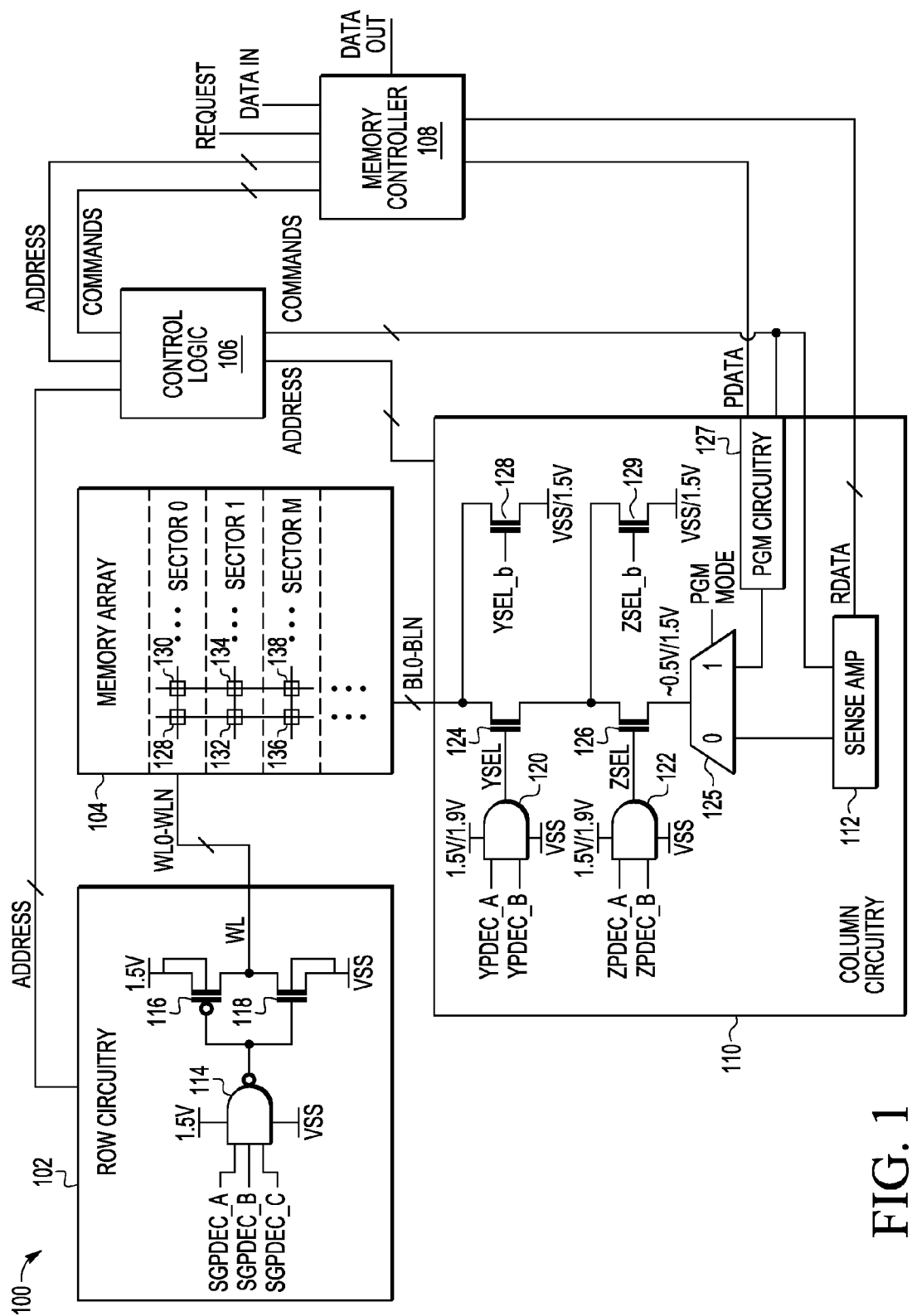
FIG. 1 illustrates, in block diagram form, a memory system having a memory array in accordance with one embodiment of the present disclosure.

FIG. 1 illustrates, in block diagram form, a memory system 100 in accordance with one embodiment of the present disclosure. Memory system 100 includes a split gate memory cell array 104 which includes a plurality of memory cells, such as memory cells 128, 130, 132, 134, 136, and 138. Array 104 may be partitioned into any number of sectors. In the illustrated embodiment, array 104 includes M+1 sectors, such as sector 0, sector 1, ..., sector M. Memory system 100 also includes row circuitry 102, column circuitry 110, control logic 106, and memory controller 108. Control logic 106 is coupled to each of row circuitry 102 and column circuitry 110, and column circuitry 110 is coupled to memory controller 108. Memory controller 108 is also coupled to row circuitry 102 and control logic 106.

Array 104 includes any number of bit lines, including BL0, BL1, BL2, etc. Each of these bit lines is coupled to column circuitry 110 which may include the appropriate sense amplifiers 112 and writing circuitry to read/write to the bit cells of array 104. Each sector of array 104 includes any number of word lines. For example, sector 0 includes N+1 word lines: WL00, WL01, ..., WL0N, and sector 1 includes N+1 word lines: WL10, WL11, ..., WL1N. Each of these word lines is coupled to row circuitry 102. A memory cell is coupled to the intersection of each word line and bit line. In the illustrated embodiment, memory cell 128 is coupled to WL00 and BL0 and is in sector 0, memory cell 130 is coupled to WL00 and BL1 and is in sector 0, memory cell 132 is coupled to WL01 and BL0 and is in sector 0, memory cell 134 is coupled to WL01 and BL1 and is in sector 0, memory cell 136 is coupled to WL10 and BL0 and is in sector 1 and memory cell 138 is coupled to WL10 and BL1 and is in sector 1. Note that each word line may be referred to as a row and each bit line as a column of array 104. As will be described in further detail below, row circuitry 102 provides the appropriate voltage values to each of the word lines, in which the word lines are coupled to the select gates of each memory cell. Memory controller 108 communicates with row circuitry 102, column circuitry 110, and control logic 106 as needed to read and write array 104. Control logic 106 also provides the appropriate voltage values for the control gates and the source terminals of each memory cell of array 104. For example, the control gate of each memory cell of sector 0 is coupled to receive control gate voltage, the source terminal of each memory cell of sector 0 is coupled to receive source terminal voltage, the control gate of each memory cell of sector 1 is coupled to receive control gate voltage, and the source terminal of each memory cell of sector 1 is coupled to receive source terminal voltage. In the illustrated embodiment, each memory cell within a sector receives the same control gate voltage and the same source terminal voltage. That is, in the illustrated embodiment, note that, within each sector, the control gate voltage is a common voltage node and the source terminal voltage is a common voltage node.

Figure 2:
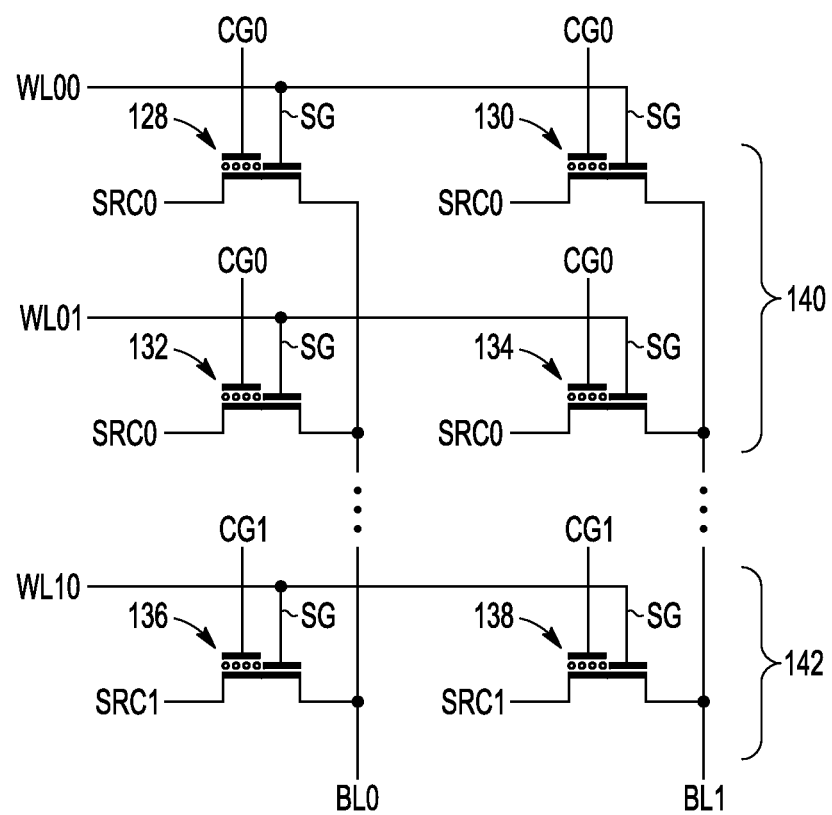
FIG. 2 illustrates, in schematic form, a portion of the memory array of FIG. 1 in further detail, in accordance with one embodiment of the present disclosure.

FIG. 2 illustrates a portion of array 104 including memory cells 128, 130, 132, 134, 136, and 138 in further detail.

Memory cell 128 has a control gate coupled to receive CG0, a select gate coupled to WL00, a source terminal coupled to receive SRC0, and a drain terminal coupled to BL0. Memory cell 130 has a control gate coupled to receive CG0, a select gate coupled to WL00, a source terminal coupled to receive SRC0, and a drain terminal coupled to BL1. Memory cell 132 has a control gate coupled to receive CG0, a select gate coupled to WL01, a source terminal coupled to receive SRC0, and a drain terminal coupled to BL0. Memory cell 134 has a control gate coupled to receive CG0, a select gate coupled to WL01, a source terminal coupled to receive SRC0, and a drain terminal coupled to BL1. Memory cell 136 has a control gate coupled to receive CG1, a select gate coupled to WL10, a source terminal coupled to receive SRC1, and a drain terminal coupled to BL0. Memory cell 138 has a control gate coupled to receive CG1, a select gate coupled to WL10, a source terminal coupled to receive SRC1, and a drain terminal coupled to BL1.

During a program operation, a particular memory cell of array 104 is selected for programming by an access address and data corresponding to an access request. Row circuitry 102 activates a selected word line corresponding to the access address and column circuitry 110 couples a current sink to the selected bit line corresponding to the access address, which causes the selected memory cell to be conductive. In the illustrated embodiment, it will be assumed that for a program operation, memory cell 128 is selected for programming, and memory cells 130, 132, 134, 136, and 138 are unselected. In this case, sector 0 is selected since the selected word line is in sector 0, and all other sectors, including sector 1, are deselected. If memory cell 128 is selected, WL00 is activated, and a current sink within column circuitry 110 is coupled to the selected bit line, BL0.

Note that although memory cells 128-138 are shown as split gate thin film storage memory cells, memory cells 128-138 can be any type of memory cell that includes a gate dielectric.

Referring back to FIG. 1, row circuitry 102 is shown with one of several word line drivers that includes NAND gate 110 having an output coupled to control gates of P-channel transistor 116 and N-channel transistor 118. Inputs to NAND gate 110 include select gate decode signals SGPDECA, SGPDECB, SGPDECC, which are based on an address of the memory cell to be accessed that is decoded by row circuitry 102. Circuitry of NAND gate 110 is coupled between a first supply voltage, such as 1.5 Volts, and a second supply voltage, such as ground or VSS. A source electrode and body tie of P-channel transistor 116 is coupled to the first supply voltage, such as 1.5 Volts, and a drain electrode of P-channel transistor 116 is coupled to a drain electrode of N-channel transistor 118. A source electrode of N-channel transistor 118 is coupled to the second supply voltage, such as VSS or ground. A word line WL00 is coupled between the drains of P-channel transistor 116 and N-channel transistor 118. Other similar driver circuits can be included in row circuitry 102 to drive other word lines WL01-WLMN, where M is the number of sectors and N is the number of rows in array 104.

Column circuitry 110 is shown with one of several bit line drivers that includes AND gates 120, 122, and N-channel transistors 124, 126, 128, 129. AND gate 120 includes input terminals coupled to address decode signals YPDECA and YPDECB. Circuitry of respective AND gates 120, 122 is coupled between a first supply voltage, such as 1.5 Volts, and a second supply voltage, such as ground or VSS. An output of AND gate 120 (shown as YSEL) is coupled to a gate electrode of N-channel transistor 124 and an output of AND gate 122 (shown as ZSEL) is coupled to a gate electrode of N-channel transistor 126. A drain electrode of N-channel transistor 124 is coupled to a first bit line BL0, and a source electrode of N-channel transistor 124 is coupled to a drain electrode of N-channel transistor 126. A source electrode of N-channel transistor 126 can be coupled to sense amplifier 112 through multiplexer 125. Sense amplifier 112 can receive currents via bit line BL0 to determine the data stored by a corresponding memory cell. Input/output circuitry 127 coupled to multiplexer 125 can provide voltages to read data from and write data to selected memory cells 128, 132, 136 in the column of array 104 coupled to bit line BL0. N-channel transistor 128 includes a drain electrode coupled to bit line BL0, a source electrode coupled to a supply voltage that can vary between the first supply voltage, such as 1.5 Volts, and VSS or ground. A gate electrode of N-channel transistor is coupled to a complement of the output of AND gate 120 (shown as YSELB). N-channel transistor 129 includes a drain electrode coupled to the source electrode of N-channel transistor 126 and a source electrode coupled to the output of multiplexer 125. A gate electrode of N-channel transistor is coupled to a complement of the output of AND gate 122 (shown as ZSELB).

Memory system 100 includes logic devices that use supra low power and high power. For example, logic devices in row circuitry 102 and column circuitry 110 that use supra low power include NAND gate 114, AND gates 120, 122, and N-channel transistors 118, 128, 129. Devices that use high power can include sense amplifier 112 and P-channel transistor 116. Forming such diverse logic circuitry and memory cells on the same substrate can substantially increase the number of masks required to form the various devices. Embodiments of devices and manufacturing methods described herein reduce the number of masks required by forming the gate oxides of memory cells 128-138 and supra low power logic devices 114, 118, 120, 122, 128, 129 during the same stage of manufacture.

FIGS. 3-14 show side cross-sectional views of an embodiment of memory system 300 that includes semiconductor wafer or substrate 302 with memory region 324, dual gate region 326, high voltage logic region 328, low voltage logic region 330 and supra low voltage logic region 332 during subsequent stages of manufacture. Dual gate region 326, high voltage logic region 328, low voltage logic region 330 and supra low voltage logic region 332 are also referred to as logic regions 326-332 herein.

Figure 3:
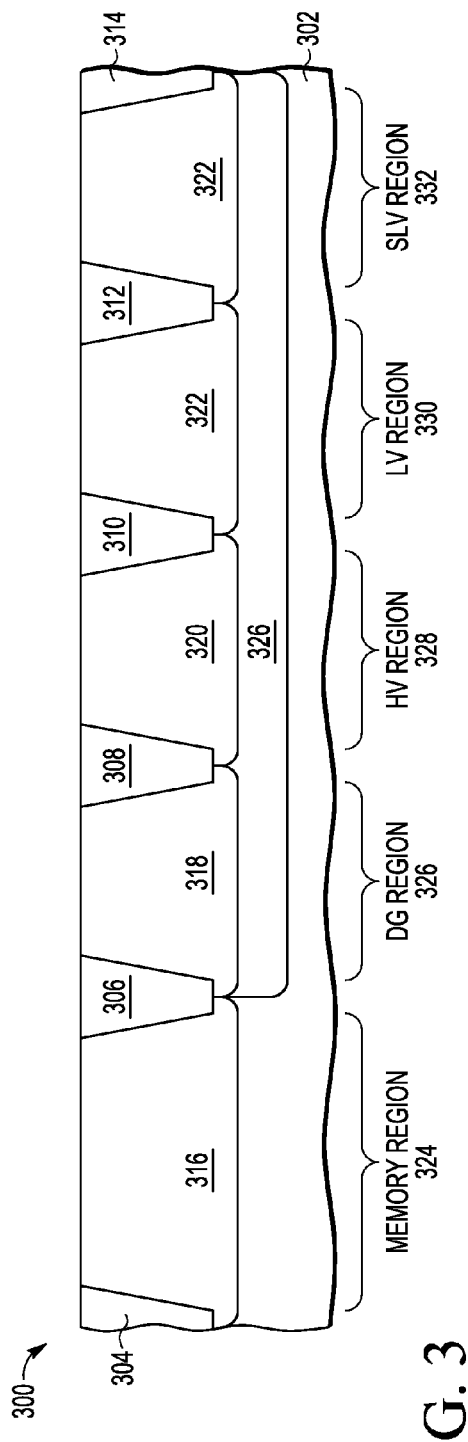

FIG. 3 shows semiconductor substrate 302 with a P well 316 of memory region 324 implanted between trench isolation regions 304 and 306, a P well 318 of dual gate region 326 implanted between trench isolation regions 306 and 308, a P well 320 of high voltage region 328 implanted between trench isolation regions 308 and 310, a P well 322 of low voltage region 330 implanted between trench isolation regions 310 and 312, and a P well 322 of supra low voltage region 332 implanted between trench isolation regions 312 and 314. A deep N-well 326 is implanted beneath P wells 318-322.

Substrate 302 can be any semiconductor material or combinations of materials, such as gallium arsenide, silicon germanium, silicon-on-insulator (SOI), silicon, monocrystalline silicon, the like, and combinations of the above. For purposes of example, substrate 302 is assumed to be a P type material, however material with opposite polarity may be used.

Trench isolation regions 304-314 are formed by removing portions of substrate 302 at the desired locations and filling regions 304-314 with insulating material, such as oxide. Isolation regions 304-314 electrically isolate devices in regions 324-332 from one another.

Deep N well 326 can be formed by masking memory region 324 with a protective material such as patterned photoresist and forming a doped region of semiconductor material within substrate 302 at a depth below the depth planned for P wells 316, 318, 320, 322 and that extends under trenches 306-314. The deep N well 326 is then formed by implanting N-type ions, such as antimony or phosphorous ions with a dopant concentration in the range of about 1E12 to about 1E14 at an energy level in the range of about 800 kiloelectron volts (keV) to about 2000 keV. In the illustrated embodiment, the depth of deep N well 326 (after subsequent thermal annealing or any other diffusion) is in the range of about 8000 to 15000 Angstroms.

P wells 316, 318, 320, 322, maybe realized by implanting as a P-type silicon material having a P-type dopant such as boron, boron difluoride ($BF_2$) or other suitable P-type material. In some embodiments, doping is performed with an energy ranging from 15 to 800 kilo-electron Volts (keV) with a dose ranging from 1E12 to 5E13 per cubic centimeter ($cm^3$). In the illustrated embodiment, the depth of deep P wells 316, 318, 320, 322 is in the range of about 100 to 8000 Angstroms.

Figure 4:
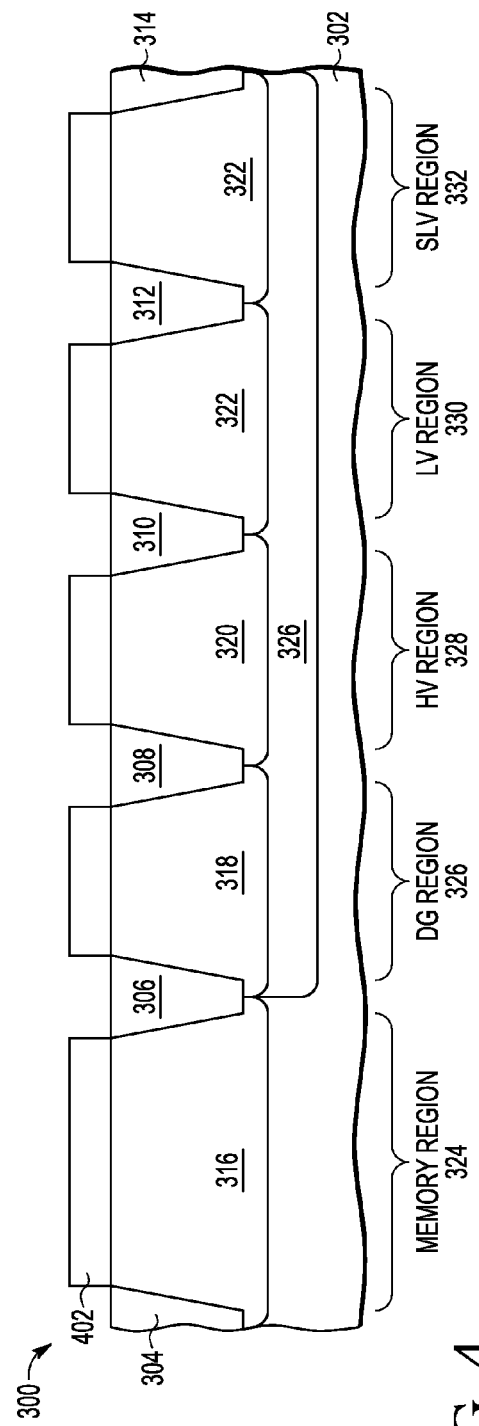

FIG. 4 shows memory system 300 with insulating layer 402 on the surface of semiconductor substrate 302 over P wells 316-322, but not over trench isolation regions 304-314. Insulating layer 402 can be any suitable material such as a grown oxide ranging in thickness from 80 to 250 Angstroms.

FIG. 5 shows semiconductor device 300 after a protective mask such as photoresist is placed over high voltage region 328, and insulating layer 402 is removed from regions 324, 326, 330, and 332 but retained over high voltage region 328. For the case of insulating layer 402 being silicon oxide, etching can be achieved using a reactive ion etch (RIE) or an HF wet etch. Another suitable isotropic etch may be used. For the case of insulating layer 402 being a high K dielectric, a different etchant, one that is selective between the high K dielectric and the semiconductor material of substrate 302, can be used.

Insulating layer 502 is then formed over regions 324-332, including over the portion of insulating layer 402 remaining over high voltage region 328. Insulating layer 502 can be any suitable material such as a grown oxide ranging in thickness from 20 to 80 Angstroms. Insulating layer 502 is shown with a dashed line above insulating layer 402 in high voltage region 328 to indicate both insulating layers 402, 502 remain to create a relatively thick gate oxide.

FIG. 6 shows semiconductor device 300 after a protective mask such as photoresist is placed over dual gate region 326, high voltage region 328, and low voltage region 330, and insulating layer 502 is removed from regions 324 and 332. For the case of insulating layer 502 being silicon oxide, etching can be achieved using a reactive ion etch (RIE) or an HF wet etch. Another suitable isotropic etch may be used. For the case of insulating layer 502 being a high K dielectric, a different etchant, one that is selective between the high K dielectric and the semiconductor material of substrate 302, can be used.

The protective layer over regions 326, 328 and 330 is then removed. Insulating layer 602 is then formed over regions 324-332, including over the portion of insulating layer 502 remaining over dual gate region 326, high voltage region 328, and low voltage region 330. Insulating layer 502 can be any suitable material such as a grown oxide ranging in thickness from 15 to 60 Angstroms. Insulating layer 602 is shown with a dashed line above insulating layer 502 in dual gate region 326, high voltage region 328, and low voltage region 330 to indicate insulating layer 502 remain to form a relatively thick gate oxide, even though insulating layers 502, 602 may be of the same or similar material.

Figure 7:
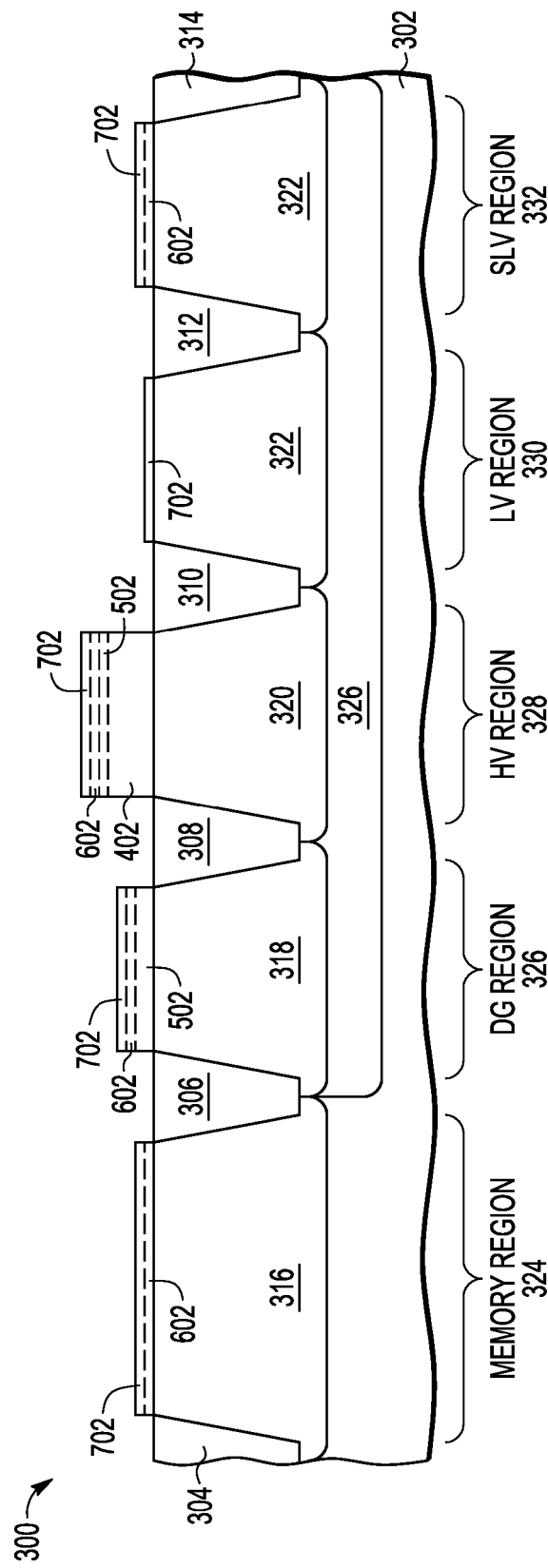

FIG. 7 shows semiconductor device 300 after a protective mask such as photoresist is placed over memory region 324, dual gate region 326, high voltage region 328, and supra low voltage region 332 and insulating layer 602 is removed from low voltage region 330. For the case of insulating layer 602 being silicon oxide, etching can be achieved using a reactive ion etch (RIE) or an HF wet etch. Another suitable isotropic etch may be used. For the case of insulating layer 602 being a high K dielectric, a different etchant, one that is selective between the high K dielectric and the semiconductor material of substrate 302, can be used.

The protective layer over regions 324, 326, 328 and 332 is then removed. Insulating layer 702 is subsequently formed over regions 324-332, including over the portion of insulating layer 602 remaining over memory region 324, dual gate region 326, high voltage region 328, and supra low voltage region 332. Insulating layer 702 can be any suitable material such as a grown oxide ranging in thickness from 10 to 40 Angstroms. Insulating layer 702 is shown with a dashed line above insulating layer 602 in memory region 324, dual gate region 326, high voltage region 328, and supra low voltage region 332 to indicate insulating layer 602 remains to form a relatively thick gate oxide, even though insulating layers 602, 702 may be of the same or similar material.

The gate dielectric for regions 324-332 are now complete with the gate dielectric for memory region 324 including insulating layers 602 and 702, the gate dielectric for dual gate region 326 including insulating layers 502, 602 and 702, the gate dielectric for high voltage region 328 including insulating layers 402, 502, 602 and 702, the gate dielectric for low voltage region 330 including insulating layer 702, and the gate dielectric for supra low voltage region 332 including insulating layers 602 and 702. Note that the gate dielectrics for memory region 324 and supra low voltage region 332 have the same thickness and are formed concurrently, instead of the gate dielectric for the memory region 324 being formed separately from the gate dielectrics for logic regions 326-332. As devices that operate on different voltages are added, the thickness required for the gate dielectrics will vary, adding to the cost of manufacturing due to the requirement for additional masking steps. Significantly, forming the gate dielectric for memory region 324 concurrently with supra low voltage region 332 avoids the need to form another set of masks that would be required if the gate dielectric for supra low voltage region 332 and logic regions 326-330 were formed independently of the gate dielectric for memory region 324.

Figure 8:
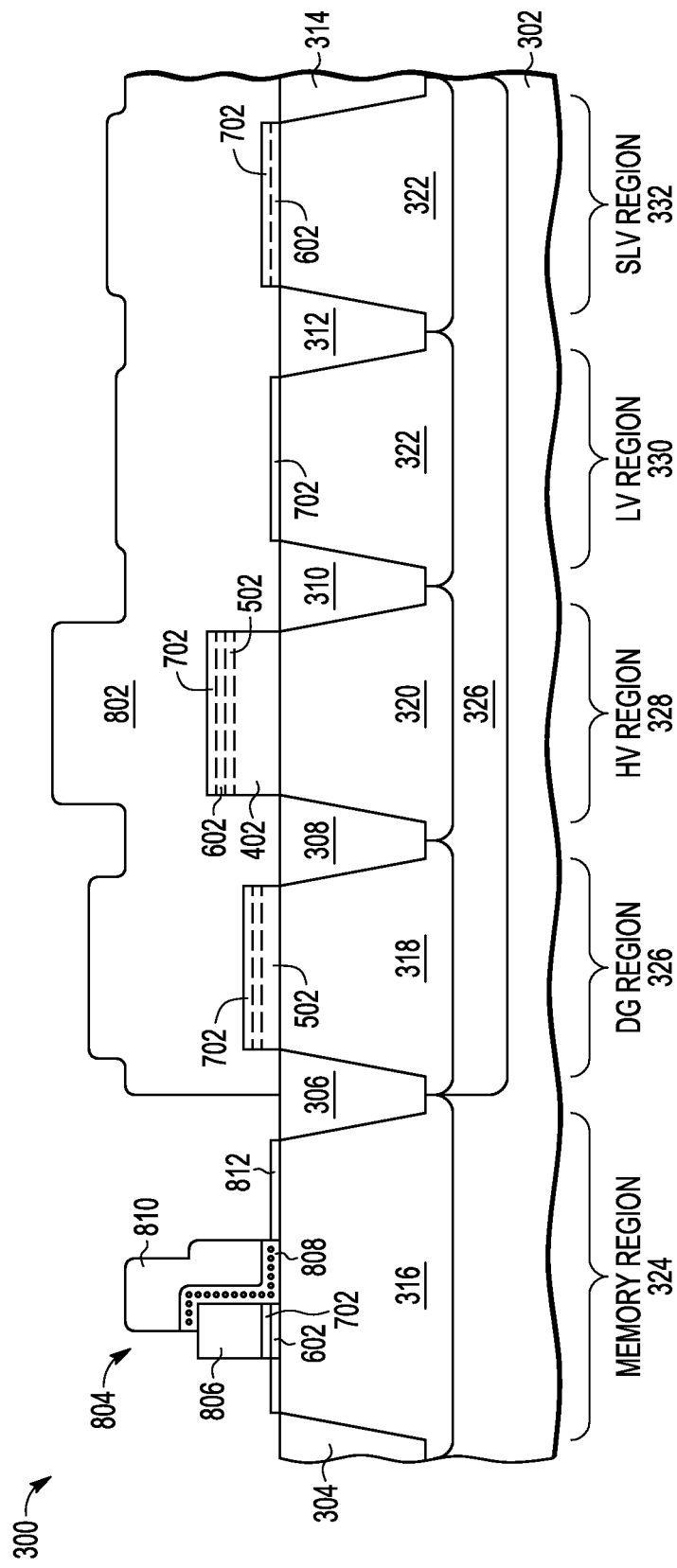

FIG. 8 shows semiconductor device 300 after a mask of polysilicon 802 is deposited over logic regions 326-332 and memory cell 804 is formed. Memory cell 804 has an overlapping split gate structure, however techniques and structures disclosed herein can be used on any type of memory cell with gate dielectric. An array of memory cells 804 as shown for example in FIG. 1 can be formed on substrate 302.

Memory cell 804 includes a select gate formed of gate dielectrics 602, 702 and a conductive layer 806 such as doped polysilicon with a thickness of 150 nanometers thick, but could be another suitable material and thickness. Conductive layer 806 and gate dielectrics 602, 702 have been etched according to a pattern. For the case of gate dielectrics 602, 702 being silicon oxide, etching can be achieved using a reactive ion etch (RIE) or an HF wet etch. Another isotropic etch may be used. For the case of gate dielectrics 602, 702 being a high K dielectric, a different etchant, one that is selective between the high K dielectric and the semiconductor material of substrate 302, could be used.

After etching gate dielectrics 602, 702, a charge storage layer 808 is formed including a bottom dielectric layer, a layer of charge storage elements and a top dielectric layer. The charge storage elements may be formed by depositing and annealing discrete storage elements of polysilicon, germanium, metal, silicon carbide, or other suitable metal or silicon material or any combinations of these materials. The bottom dielectric layer may be a thermal layer in order to withstand the heat of nanocrystal formation. A high-k dielectric material may be used as the bottom dielectric layer with metal nanocrystals or when a lower temperature silicon nanocrystal formation process is used. The top oxide or dielectric layer may be formed of a suitable dielectric material such as silicon dioxide having a thickness. Another conductive layer 810 is formed over charge storage lager 808. Conductive layer 810 may be doped polysilicon or other conductive material or combination of materials. Charge storage layer 808 and conductive layer 810 are patterned with a first portion that partially overlaps select gate 806 and another portion that partially overlaps substrate 302. A thin layer of oxide 812 is used to protect P well 316 during gate etching.

Figure 9:
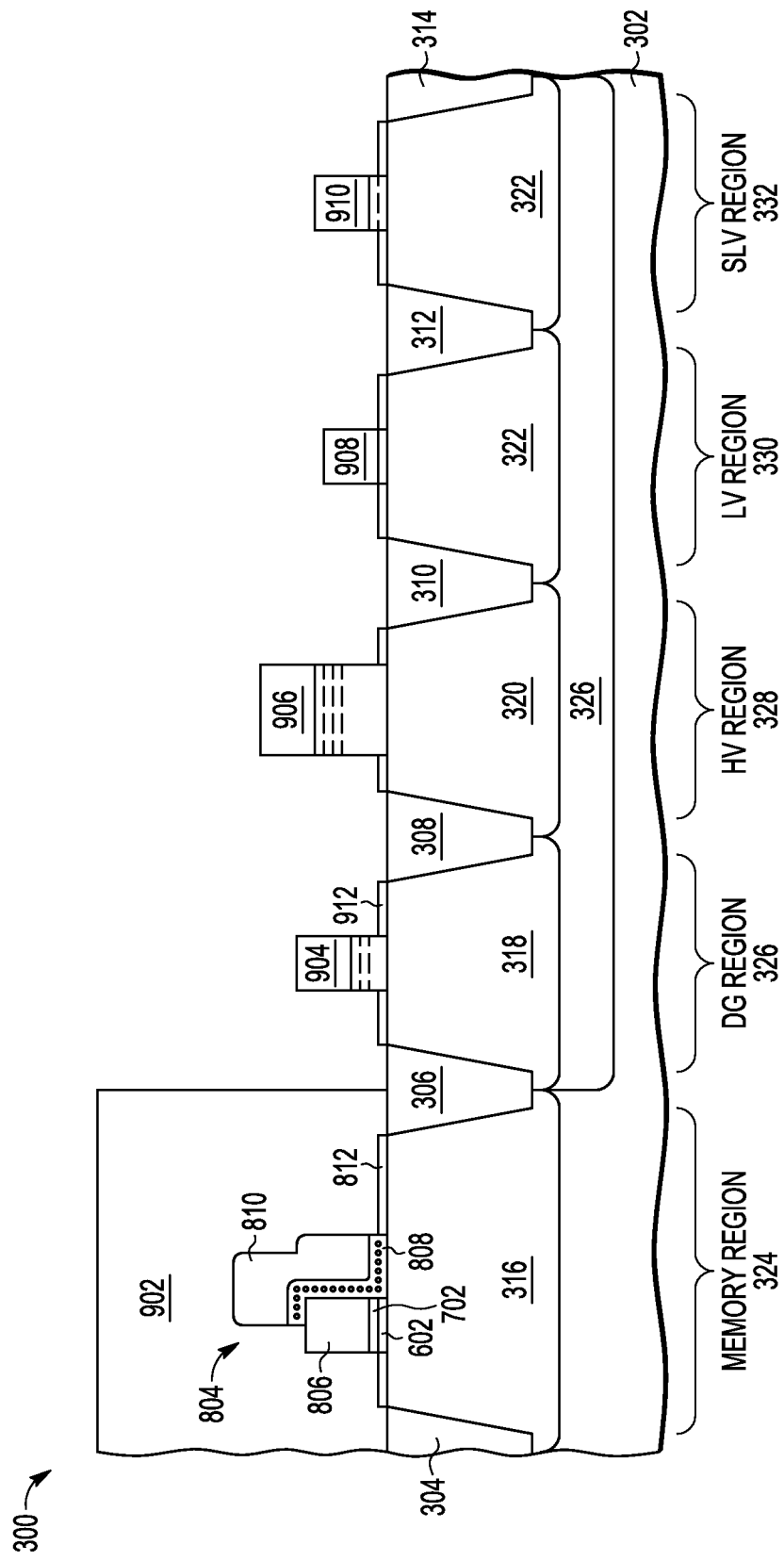

FIG. 9 shows semiconductor device 300 after polysilicon layer 802 (FIG. 8) and gate dielectric layers 402, 502, 602, 702 (FIG. 8) are etched into gate structures 904, 906, 908, 910. The gate structures 904-910 vary in size, depending on the voltage expected to be used when operating a corresponding device. For example, the size of gate 906 in high voltage region 328 is much larger than gates 904, 908, 910 in respective dual gate region 326, low voltage region 330 and supra low voltage region 332. Further, the gate dielectric for each control gate 904-910 each have different thicknesses directly proportional to the voltages expected to be used during operation. A thin layer of oxide residue 912 is used to protect P wells 318, 320, 322 during gate etching.

Figure 10:
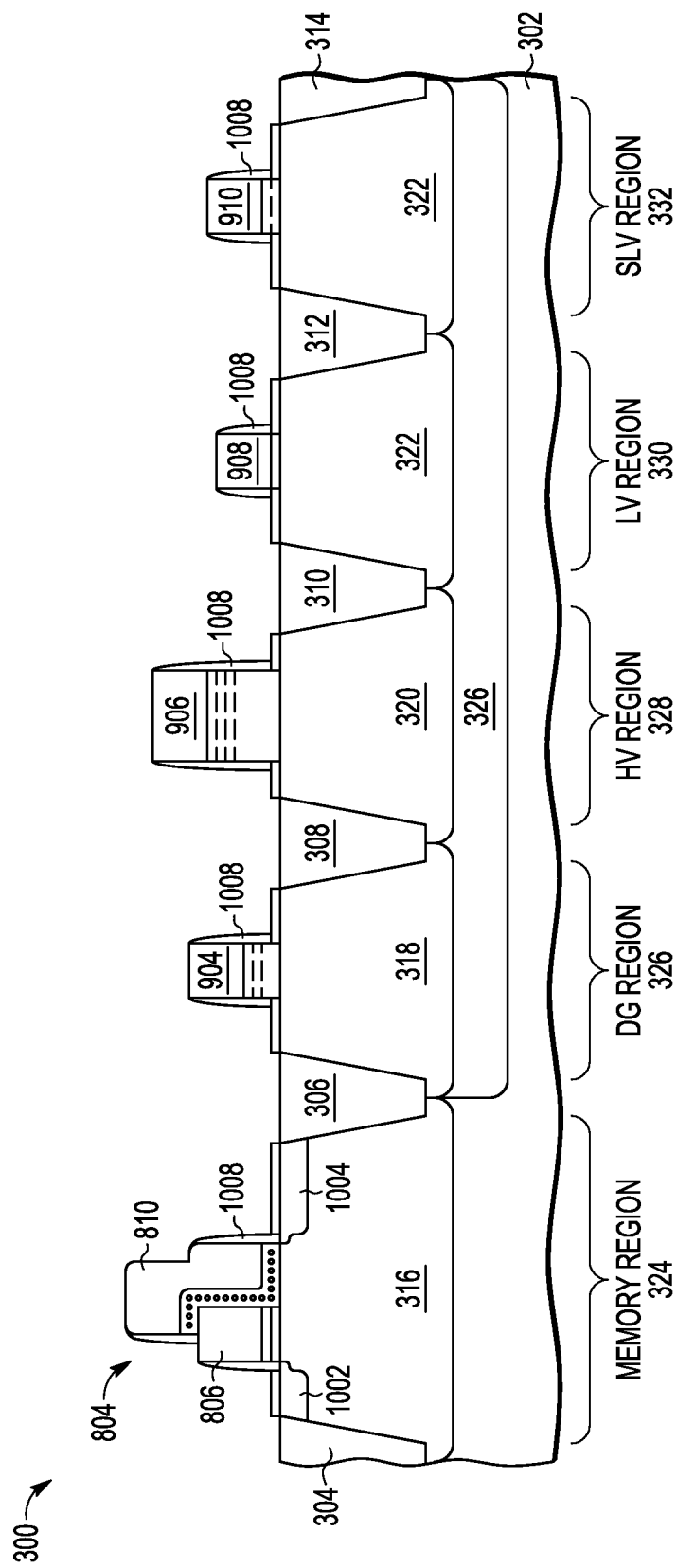

FIG. 10 shows semiconductor device 300 after spacers 1008 are formed around sidewalls of gates 806, 810, 904, 906, 908, and 910 and source/drain extension regions 1002, 1004 are formed by implanting P well 316 with N-type ions, such as arsenic or phosphorous ions with a dopant concentration in the range of about 1E12 to about 1E15 at an energy level in the range of about 10 kiloelectron volts (keV) to about 150 keV. A photoresist mask (not shown) is typically deposited over logic regions 326-332 while source/drain regions 1002, 1004 are formed. After the first doping, a second doping of source/drain extension regions 1002, 1004 can be performed to form an extension under the first doped region of source/drain extension regions 1002, 1004 by doping P well 316 with the N-type ions. Spacer 1006 can be formed of oxide, nitride or other suitable material. The protective mask can then be removed from logic regions 326-332.

Figure 11:
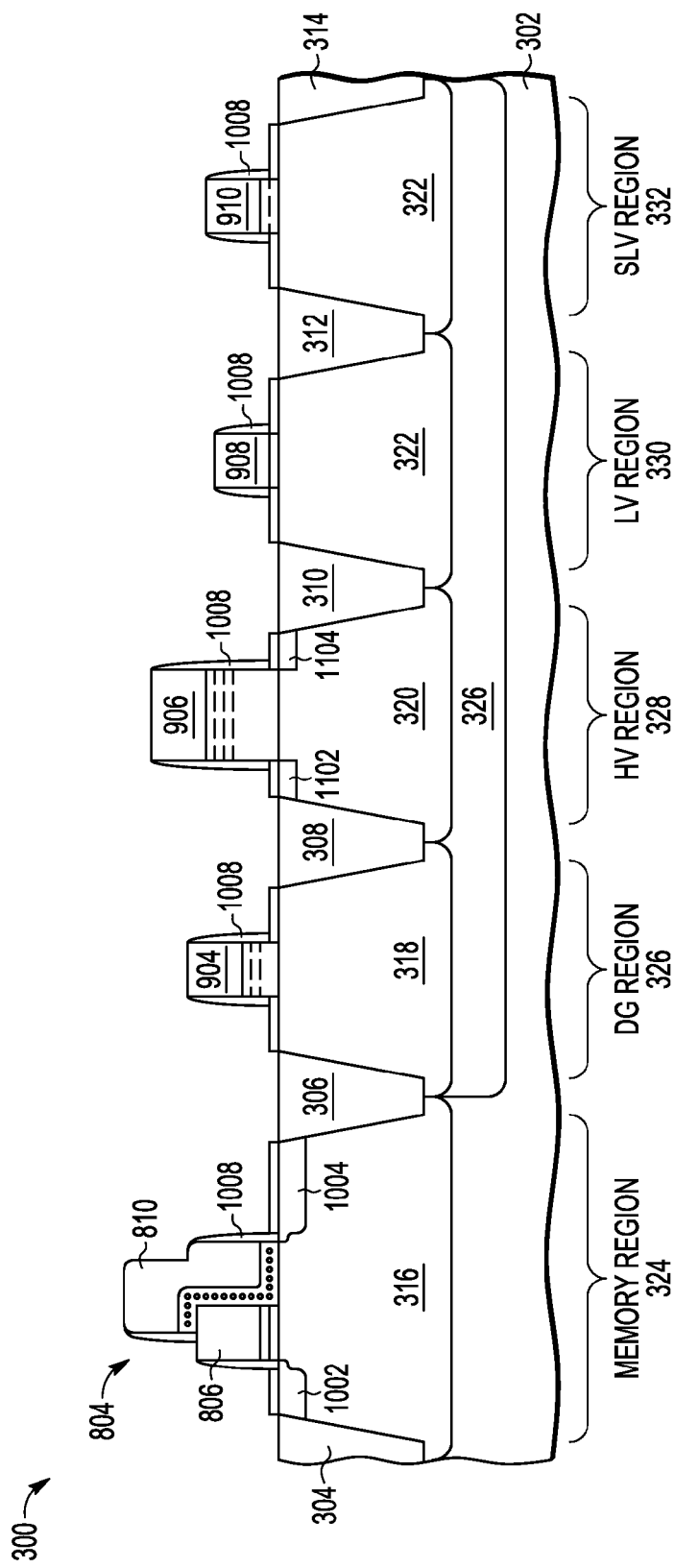

FIG. 11 shows semiconductor device 300 after source/drain extension regions 1102, 1104 are formed. A protective mask (not shown) is deposited over memory region 324 and logic regions 326, 330 and 332 and source/drain extension regions 1102, 1104 are formed in P well 320 by implanting with N-type ions, such as arsenic or phosphorous ions with a dopant concentration in the range of about 1E12 to about 1E14 at an energy level in the range of about 5 kiloelectron volts (keV) to about 50 keV.

Figure 12:
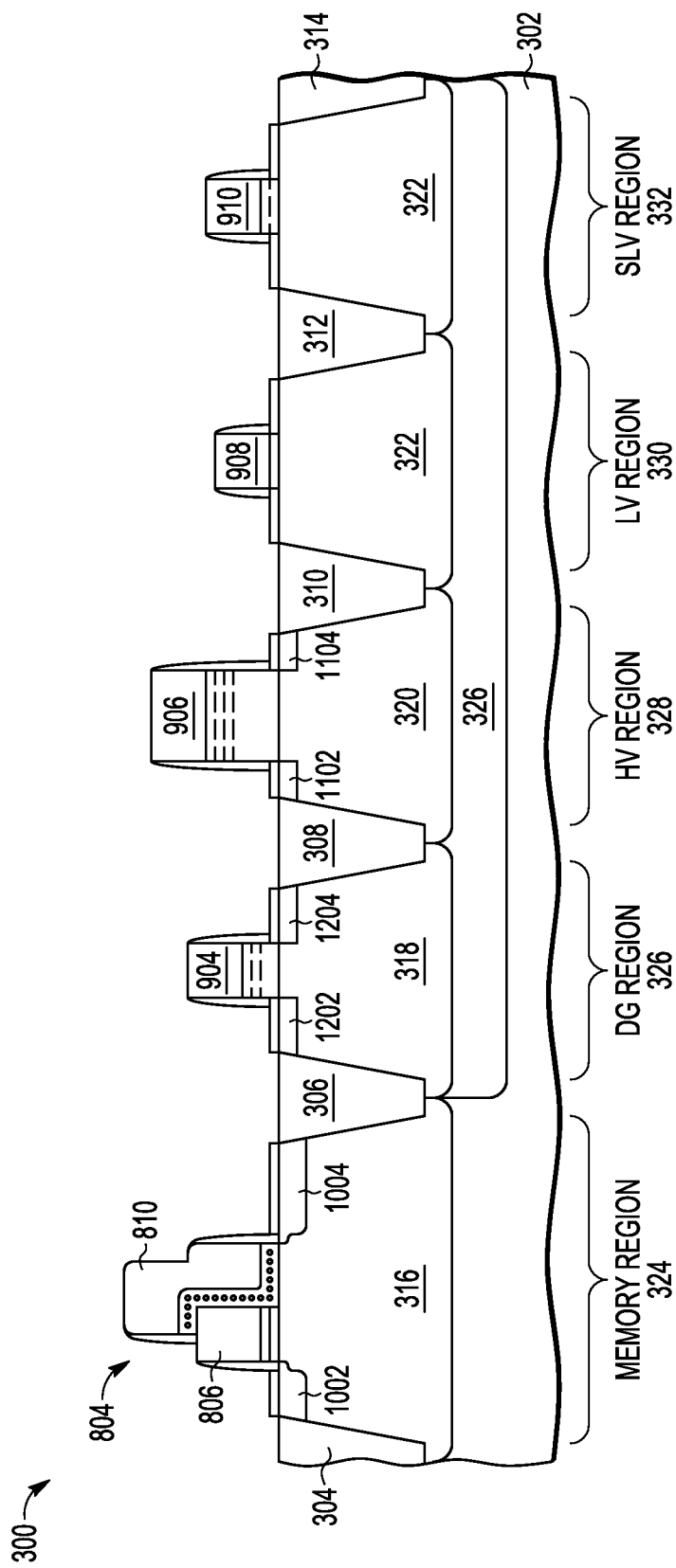

FIG. 12 shows semiconductor device 300 after a protective mask (not shown) is deposited over memory region 324 and logic regions 328, 330 and 332 and source/drain extension regions 1202, 1204 are formed in P well 318 by implanting with N-type ions, such as arsenic or phosphorous ions with a dopant concentration in the range of about 1E12 to about 1E14 at an energy level in the range of about 5 kiloelectron volts (keV) to about 40 keV.

Figure 13:
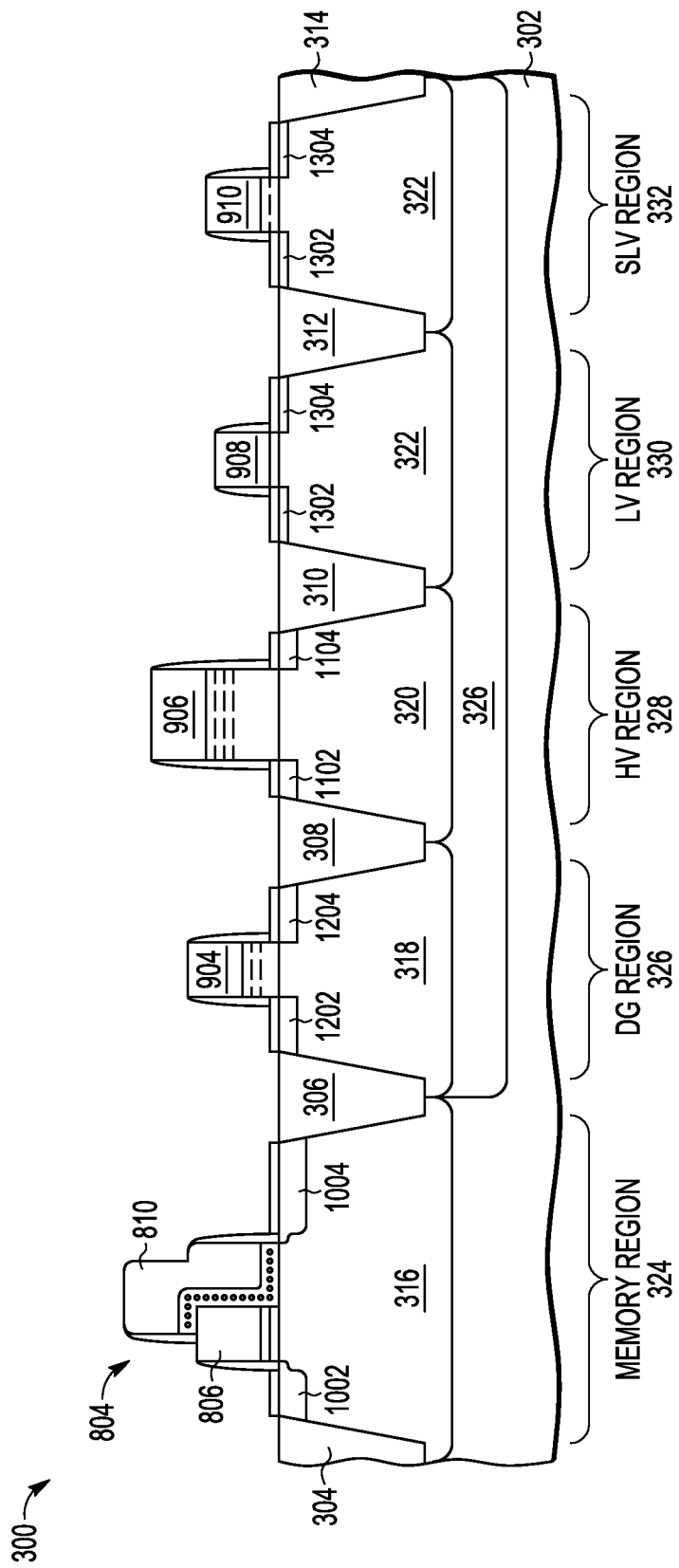

FIG. 13 shows semiconductor device 300 after a protective mask (not shown) is deposited over memory region 324 and logic regions 326 and 328 and source/drain extension regions 1302, 1304 are formed in P wells 322 by implanting with N-type ions, such as arsenic or phosphorous ions with a dopant concentration in the range of about 1E13 to about 1E15 at an energy level in the range of about 1 kiloelectron volts (keV) to about 20 keV.

Figure 14:
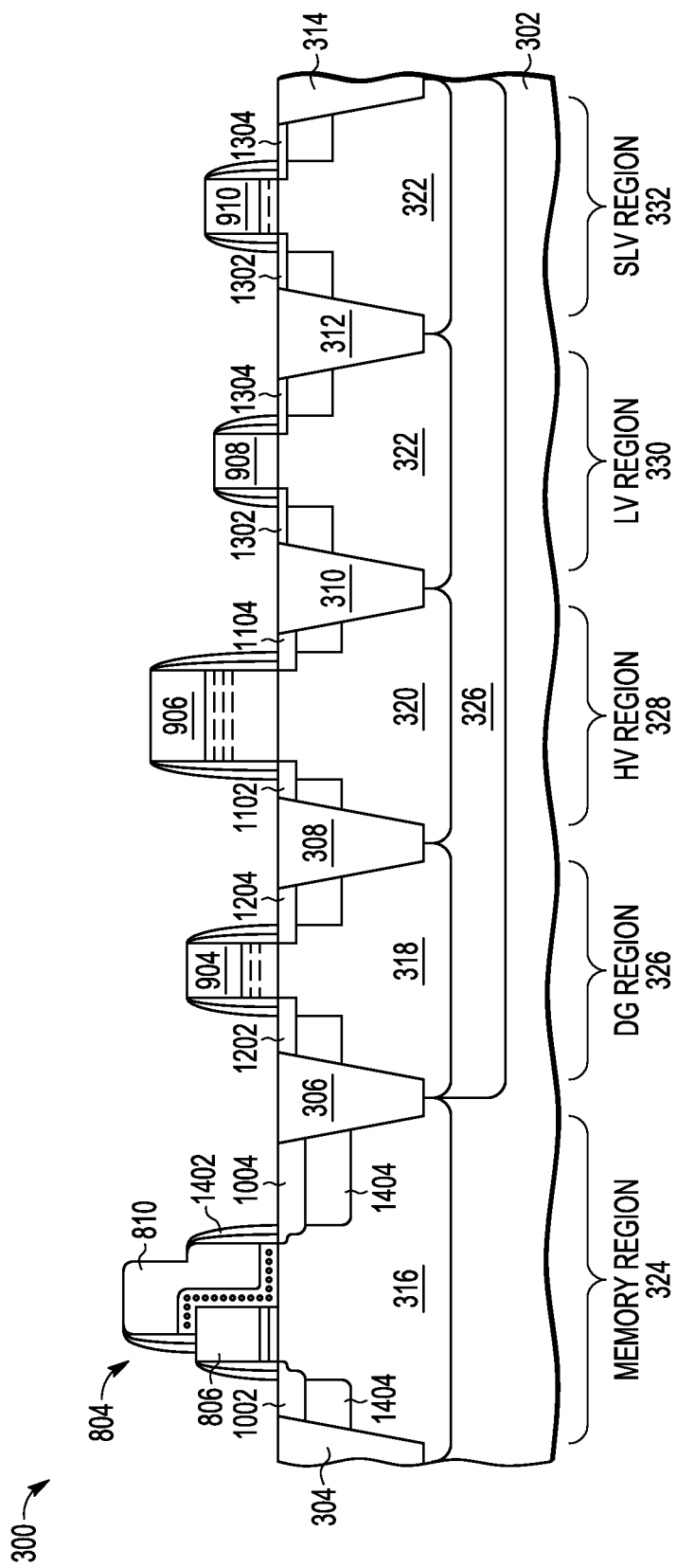

FIG. 14 shows semiconductor device 300 after spacers 1402 are formed around the sidewalls of gates 806, 810, 904-910. Spacers 1402 can be formed of oxide nitride or other suitable material. Deep implants 1404 are then formed in each of P wells 316-322 by implanting with N-type ions, such as arsenic or phosphorous ions with a dopant concentration in the range of about 1E13 to about 5E15 at an energy level in the range of about 10 kiloelectron volts (keV) to about 50 keV.

Semiconductor device 300 may undergo further processing as known by those skilled in the art such as, for example, siliciding source/drain extension regions 1002, 1004, 1102, 1104, 1202, 1204, 1302, 1304 and exposed portions of select gate 806 and control gates 810 and 904-910 using conventional processing techniques. In addition, one or more metal interconnect layers (not shown) may be formed to provide electrical connections for components on semiconductor device 300. Also further processing to form P-type devices may be performed, as understood by those skilled in the art.

By now it should be understood that in some embodiments, there has been provided a method of making a semiconductor structure using a substrate, wherein the semiconductor structure comprises a non-volatile memory (NVM) structure in an NVM region of the substrate. The method can comprise forming isolation regions (304, 306, 308, 310, 312, 314) in the substrate (302), and forming wells (316, 318, 320, 322) between the isolation regions. The wells can comprise a first low voltage well (322/right LV PW region) and a second low voltage well (322/left LV PW region) in a logic region of the substrate, and a memory array well (316) in the NVM region. A first layer of oxide (602) can be formed over the first low voltage well (322 right) and the memory array well (316). A second layer of oxide (702) can be formed over the second low voltage well (322 left). The second layer of oxide is thinner than the first layer of oxide. Gates (804, 904, 906, 908, 910) can be formed over the wells. A first gate (910) includes the first layer of oxide over the first low voltage well. A second gate (908) includes the second layer of oxide over the second low voltage well. A memory cell gate (804) includes the first layer of oxide over the memory array well. Source/drain extension regions (1002, 1004, 1202, 1204, 1102, 1104, 1302, 1304) are formed around the gates.

In another aspect, forming the isolation regions can comprise etching trenches into the substrate; depositing oxide into the trenches to form the isolation regions; and polishing a top surface of the substrate.

In another aspect, the first low voltage well and the second low voltage well can be formed using a same implant dopant.

In another aspect, forming the first oxide of layer can comprise growing the first layer of oxide over the wells, including the first low voltage well, the second low voltage well, and the memory array well. The first layer of oxide can be removed from over the second low voltage well to leave the first layer of oxide over the first low voltage well and the memory array well.

In another aspect, a first extension region around the first gate and a second extension region around the second gate are formed using a same lightly doped drain (LDD) implant dopant.

In another aspect, the memory cell gate can comprise one of a split gate and a floating gate.

In another aspect, the wells can further comprise a high voltage well (320) and a dual gate well (904) in the logic region, and the gates can further comprise a third gate (904) over the dual gate well and a fourth gate (906) over the high voltage well.

In another aspect, the first gate, the second gate, the third gate, and the fourth gate can be formed using a same gate etch process.

In another aspect, the first gate, the second gate, the third gate, and the fourth gate can comprise a conductive layer having a same thickness in each of the first, second, third, and fourth gates.

In another aspect, extension regions around the memory cell gate, the second gate, the third gate, and the fourth gate can be formed using different lightly doped drain (LDD) implant dopants.

In another aspect, the method can further comprise growing a third layer of oxide (402) over the wells. Prior to the forming the first layer of oxide, the third layer of oxide can be removed from over the dual gate well (318) to leave the third layer over the high voltage well (320). A fourth layer of oxide (502) can be grown over the wells, subsequent to the removing the third layer and prior to the forming the first layer. The fourth layer of oxide can be removed from over the first low voltage well (322 right) and the memory array well (316) to leave the fourth layer over the dual gate well (318). The first layer of oxide (602) can be grown over the wells, subsequent to the removing the fourth layer, wherein the forming the first layer comprises the growing the first layer. The first layer of oxide can be removed from over the second low voltage well (322 left) to leave the first layer over the first low voltage well (322 right) and the memory array well (318). The second layer of oxide (702) can be grown over the wells, subsequent to the removing the first layer of oxide, wherein the forming the second layer comprises the growing the second layer.

In another aspect, the first gate in the first low voltage well can be included in a semiconductor device that is part of a supra-low voltage circuit (102 or 110) in the logic region. The supra-low voltage circuit can comprise one of a column select circuit (110) and a row select driver circuit (102). The supra-low voltage driver circuit can operate in a supra-low power domain.

In another aspect, the supra-low power domain has a maximum voltage of 2 volts.

In another embodiments, a method of making a semiconductor structure using a substrate is provided. The semiconductor structure comprises a non-volatile memory (NVM) structure in an NVM region of the substrate. The method can comprise forming isolation regions (304, 306, 308, 310, 312, 314) in the substrate (302) and forming wells (316, 318, 320, 322) between the isolation regions. The wells can comprise a memory array well (316) in the NVM region, and a first low voltage well (322/right LV PW region), a second low voltage well (322/left LV PW region), a dual gate well (318), and a high voltage well (320) in a logic region of the substrate. A first layer of oxide (402) can be grown over the wells. The first layer of oxide can be removed from over the memory array well, the first low voltage well, the second low voltage well, and the dual gate well. A second layer of oxide (502) can be grown over the wells. The second layer of oxide can be removed over the memory array well, the first low voltage well, and the second low voltage well. A third layer of oxide (602) can be grown over the wells. The third layer of oxide can be removed from over the second low voltage well. The third layer of oxide can have a same thickness over the first low voltage well and the memory array well. A fourth layer of oxide (702) can be grown over the wells.

In another aspect, the method can further comprise forming gates (804, 904, 906, 908, 910) over the wells. The gates can comprise a first gate (910) over the first low voltage well, the first gate including the third layer of oxide (602), a second gate (908) over the second low voltage well, the second gate including the fourth layer of oxide (702), a third gate (904) over the dual gate well, the third gate including the second layer of oxide (502), a fourth gate (906) over the high voltage well, the fourth gate including the first layer of oxide (402), and a memory cell gate (804) over the memory array well, the memory cell gate including the third layer of oxide (602). Source/drain extension regions (1002,1004, 1202, 1204, 1102, 1104, 1302, 1304) can be formed around the gates.

In another aspect, a first extension region around the first gate and a second extension region around the second gate can be formed using a same lightly doped drain (LDD) implant dopant.

In another aspect, the first gate, the second gate, the third gate, and the fourth gate can be formed using a same gate etch process, and the first gate, the second gate, the third gate, and the fourth gate can comprise a conductive layer having a same thickness in each of the first, second, third, and fourth gates.

In another aspect, the first low voltage well and the second low voltage well can be formed using a same implant dopant.

In another embodiment, a semiconductor structure using a substrate having a non-volatile memory (NVM) region and a logic region can comprise isolation regions in the substrate; and wells between the isolation regions. The wells can comprise a memory array well in the NVM region, and a first low voltage well and a second low voltage well in a logic region of the substrate. A first gate (910) can be over the first low voltage well. The first gate includes a first layer of oxide (602). A second gate (908) can be over the second low voltage well. The second gate includes a second layer of oxide (702). The first low voltage well and the second low voltage well include a same implant dopant; and a memory cell gate (804) over the memory array well, the memory cell gate including the first layer of oxide.

In another aspect, the first gate in the first low voltage well can be included in a semiconductor device that is part of a supra-low voltage circuit (102 or 110) in the logic region. The supra-low voltage circuit can comprise one of a column select circuit (110) and a row select driver circuit (102), and the supra-low voltage driver circuit can operate in a supra-low power domain.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Although the invention is described herein with reference to specific embodiments, various modifications and changes can be made without departing from the scope of the present invention as set forth in the claims below. For example, different split gate configurations may be used to implement each memory cell. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of making a semiconductor structure using a substrate, wherein the semiconductor structure comprises a non-volatile memory (NVM) structure in an NVM region of the substrate, the method comprising:
    forming isolation regions in the substrate;
    forming wells between the isolation regions, wherein
        the wells comprise a first low voltage well and a second low voltage well in a logic region of the substrate, and a memory array well in the NVM region;
    forming a first layer of oxide over the first low voltage well and the memory array well;
    forming a second layer of oxide over the second low voltage well, wherein the second layer of oxide is thinner than the first layer of oxide;
    forming gates over the wells, wherein the gates comprise
        a first gate over the first low voltage well, the first gate including the first layer of oxide,
        a second gate over the second low voltage well, the second gate including the second layer of oxide, and
        a memory cell gate over the memory array well, the memory cell gate including the first layer of oxide; and
    forming source/drain extension regions around the gates.

2. The method of claim 1, wherein the forming the isolation regions comprises:
    etching trenches into the substrate;
    depositing oxide into the trenches to form the isolation regions; and
    polishing a top surface of the substrate.

3. The method of claim 1, wherein
the first low voltage well and the second low voltage well are formed using a same implant dopant.

4. The method of claim 1, wherein the forming the first oxide of layer comprises
    growing the first layer of oxide over the wells, including the first low voltage well, the second low voltage well, and the memory array well; and
    removing the first layer of oxide from over the second low voltage well to leave the first layer of oxide over the first low voltage well and the memory array well.

5. The method of claim 1, wherein
a first extension region around the first gate and a second extension region around the second gate are formed using a same lightly doped drain (LDD) implant dopant.

6. The method of claim 1, wherein
the memory cell gate comprises one of a split gate and a floating gate.

7. The method of claim 1, wherein
the wells further comprise a high voltage well and a dual gate well in the logic region, and
the gates further comprise a third gate over the dual gate well and a fourth gate over the high voltage well.

8. The method of claim 7, wherein
the first gate, the second gate, the third gate, and the fourth gate are formed using a same gate etch process.

9. The method of claim 7, wherein
the first gate, the second gate, the third gate, and the fourth gate comprise a conductive layer having a same thickness in each of the first, second, third, and fourth gates.

10. The method of claim 7, wherein
extension regions around the memory cell gate, the second gate, the third gate, and the fourth gate are formed using different lightly doped drain (LDD) implant dopants.

11. The method of claim 7, further comprising:
    growing a third layer of oxide over the wells, prior to the forming the first layer of oxide;
    removing the third layer of oxide from over the dual gate well to leave the third layer over the high voltage well;
    growing a fourth layer of oxide over the wells, subsequent to the removing the third layer and prior to the forming the first layer;
    removing the fourth layer of oxide from over the first low voltage well and the memory array well to leave the fourth layer over the dual gate well;
    growing the first layer of oxide over the wells, subsequent to the removing the fourth layer, wherein the forming the first layer comprises the growing the first layer;
    removing the first layer of oxide from over the second low voltage well to leave the first layer over the first low voltage well and the memory array well; and
    growing the second layer of oxide over the wells, subsequent to the removing the first layer of oxide, wherein the forming the second layer comprises the growing the second layer.

12. The method of claim 1, wherein
the first gate in the first low voltage well is included in a semiconductor device that is part of a supra-low voltage circuit in the logic region,
the supra-low voltage circuit comprising one of a column select circuit and a row select driver circuit, and
the supra-low voltage driver circuit operates in a supra-low power domain.

13. The method of claim 12, wherein
the supra-low power domain has a maximum voltage of 2 volts.

* * * * *